(12) United States Patent
Quilligan et al.

(10) Patent No.: US 11,476,804 B1
(45) Date of Patent: Oct. 18, 2022

(54) RADIATION HARDENED BY DESIGN CMOS CRYSTAL OSCILLATOR FOR READOUT TELEMETRY

(71) Applicant: United States of America as represented by the Administrator of NASA, Washington, DC (US)

(72) Inventors: Gerard T. Quilligan, Gulf Breeze, FL (US); Terry Hurford, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 17/532,689

(22) Filed: Nov. 22, 2021

(51) Int. Cl.
| | | |
|---|---|---|
| *H03B 5/36* | (2006.01) | |
| *H03B 5/12* | (2006.01) | |
| *H03L 1/00* | (2006.01) | |
| *G05F 3/02* | (2006.01) | |
| *H04B 1/04* | (2006.01) | |
| *H03K 3/011* | (2006.01) | |

(52) U.S. Cl.
CPC ............... *H03B 5/364* (2013.01); *G05F 3/02* (2013.01); *H03B 5/1228* (2013.01); *H03K 3/011* (2013.01); *H03L 1/00* (2013.01); *H04B 1/04* (2013.01)

(58) Field of Classification Search
CPC ........ H03B 5/364; H03B 5/1228; H04B 1/04; H03L 1/00; G05F 3/02; H03K 3/011
USPC ........... 331/158, 116 FE, 176, 183, 185, 167
See application file for complete search history.

(56) References Cited

U.S. PATENT DOCUMENTS

| | | | |
|---|---|---|---|
| 10,061,340 B1* | 8/2018 | Rao .......................... | G05F 3/267 |
| 2012/0319793 A1* | 12/2012 | Iwasa ...................... | H03K 3/011 |
| | | | 331/176 |

* cited by examiner

*Primary Examiner* — Arnold M Kinkead
(74) *Attorney, Agent, or Firm* — Christopher O. Edwards; Bryan A. Geurts; Helen M. Galus

(57) ABSTRACT

A clock source includes a comparator having a positive comparator input, a negative comparator input, a proportional to absolute temperature (PTAT) PMOS bias input, a PTAT NMOS bias input, and a comparator output, a resonator element, series and feedback resistors and other passive components coupled between the comparator output and the negative comparator input to generate a signal with approximately constant gain and frequency at the comparator output, and a PTAT bias circuit coupled to the comparator's PTAT PMOS and NMOS bias inputs, and configured to drive the PTAT PMOS bias input and the PTAT NMOS bias input to maintain approximately constant gain and frequency over the operating temperature range of the clock source.

10 Claims, 5 Drawing Sheets

ND BY DESIGN CMOS CRYSTAL OSCILLATOR FOR READOUT TELEMETRY

ORIGIN OF THE INVENTION

Invention by Government Employee(s) Only

The invention described herein was made by one or more employees of the United States Government, and may be manufactured and used by or for the Government for governmental purposes without the payment of any royalties thereon or therefor.

FIELD

The present disclosure relates to crystal stabilized oscillator circuitry, in particular to a Radiation Hardened By Design (RHBD) high frequency crystal stabilized oscillator for clock signal generation and data transmission.

BACKGROUND

There is an unmet need for radiation hardened crystal stabilized clock sources, in particular, those with at least 300 krad of Total Ionizing Dose (TID) immunity and immunity to single event latch-up, suitable for use in hazardous space environments. In CMOS, TID can cause excessive leakage currents to flow between NMOS drain-source terminals and/or change the device threshold voltages to the extent that both functionality and performance of a CMOS based oscillator can be severely degraded. The lack of radiation hard clock sources can pose a significant challenge to instrument design for space applications and a common solution has been to spot-shield a Commercial Off The Shelf (COTS) part, or enclose the part in a vault to achieve the required immunity. Radiation hard clock sources are particularly required for main electronics boards and readout electronics that can operate in hazardous space environments, for example, the Jupiter orbital system.

Typical crystal stabilized clock sources, for example, those incorporating Pierce oscillators based on CMOS amplifier technology, are also temperature sensitive. Generally, as temperatures change, the gain and speed of the oscillator amplifier also tend to change, resulting in a possible degradation of performance.

Space-based remote sensing and telemetry applications often require that a readout circuit, used to read signals from various sensor configurations, be co-located with the sensors. The readout circuit may include one or more filtering, amplifying, and conditioning circuits for processing the sensor output in the analog domain and then one or more Analog to Digital Converters (ADCs) for digitizing the signals for transmission over an arbitrary distance to data processing electronics, such as receivers, main electronics boards, computers, or controllers. The data processing electronics typically provide a clock signal directed to the readout circuit to synchronize the analog to digital conversion and for transmitting the digitized signals to the data processing electronics. The data processing electronics clock signal may be wired or wireless, but nevertheless would require additional mass and power dependent on the clock frequency, phase noise requirements and the distance traversed. Furthermore, serial transmission of a complete ADC word generally requires knowledge of the position of the least or most significant bits in order to correctly reconstruct the ADC word, however, noise or interference may result in corrupt or missing bits and/or loss of synchronization.

It would be advantageous therefor to provide an RHBD high frequency crystal stabilized oscillator for clock signal generation and data transmission applications that addresses these and other problems.

SUMMARY

In at least one aspect, the disclosed embodiments are directed to a clock source including a comparator having a positive comparator input, a negative comparator input, a proportional to absolute temperature (PTAT) PMOS bias input, a PTAT NMOS bias input, and a comparator output; a resonator element and feedback resistor coupled between the comparator output and the negative comparator input to generate a waveform with a user determined gain and frequency at the comparator output; a PTAT bias circuit coupled to the PTAT PMOS and NMOS bias inputs, and configured to drive the PTAT PMOS and the NMOS bias inputs to maintain the correct gain and frequency over an operating temperature range of the clock source.

The PMOS and NMOS comparator bias input(s) may be configured to be driven to compensate for radiation induced input offset drift with temperature.

The positive comparator input may be configured to be driven to adjust a pulse width or duty cycle of the comparator output.

The resonator may include an inductor-capacitor (LC) tank circuit or a piezo-electric crystal, along with various passive components such as resistors and capacitors.

The PTAT PMOS and NMOS bias inputs may be coupled to current sources in the comparator and the PTAT bias circuit may be configured to provide current to the current sources that varies with temperature.

In another aspect, the disclosed embodiments are directed to a method of generating a clock signal using a comparator having a positive comparator input, a negative comparator input, a proportional to absolute temperature (PTAT) PMOS bias input, a PTAT NMOS bias input, and a comparator output.

The method may include coupling a resonator element and series resistor between the comparator output and the negative comparator input to generate a clock signal at the comparator output; and a feedback resistor between the comparator output and the comparator negative input to provide a DC path for linearizing gain of the comparator.

The method may also include coupling a PTAT bias circuit to the PTAT PMOS bias input and the PTAT NMOS bias input, the PTAT bias circuit configured to drive the PTAT PMOS bias input and the PTAT NMOS bias input to maintain an approximately constant gain and frequency of the clock signal over an operating temperature range of the clock source.

The method may additionally include configuring the positive comparator input to be driven to compensate for radiation induced input offset.

The method may further include configuring the positive comparator input to be driven to adjust a pulse width or duty cycle of the comparator output.

The resonator may include an LC tank circuit or a piezo-electric crystal.

The method may still further include coupling the PTAT PMOS bias input and the PTAT NMOS bias input to current sources in the comparator and configuring the PTAT bias circuit to provide current to the current sources that varies with temperature.

DETAILED DESCRIPTION

Figure 1:
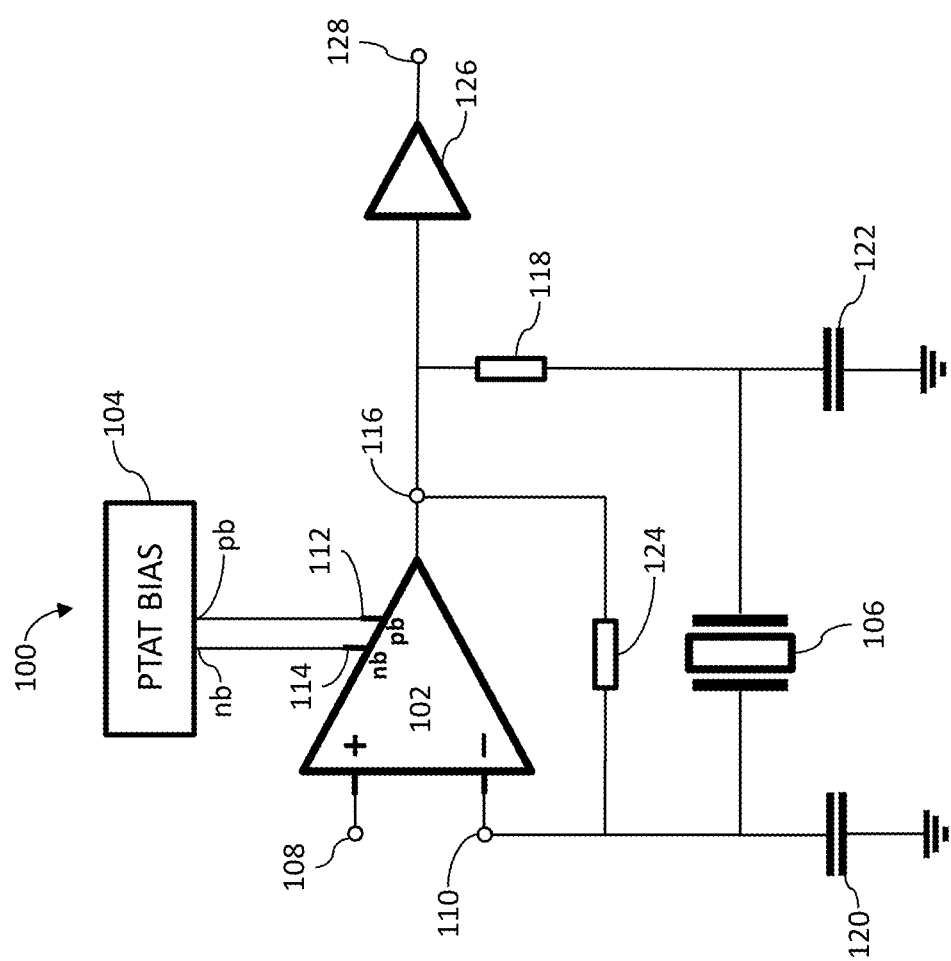
FIG. 1 illustrates an exemplary RHBD clock source according to the disclosed embodiments.

The disclosed embodiments are generally directed to an RHBD clock source that provides an enhanced level of TID immunity and allows a readout circuit to generate local clock signals for digitizing sensor signals and for transmitting the resulting data to data processing electronics via a wired or wireless link without the need for a clock or synchronization signal from the data processing electronics.

To achieve an enhanced level of TID immunity, the RHBD clock source may be fabricated with enclosed layout transistor (ELT) metal oxide semiconductor (MOS) devices and dual guard rings. The ELTs may provide high immunity to TID induced leakage and the dual guard rings may provide immunity to single event latch-up (SEL). The RHBD clock source may also include a comparator constructed to be driven by a variable reference voltage to affect a variable duty cycle clock signal. The ability to adjust the duty cycle of the RHBD clock source allows a system in which the RHBD clock source is installed, to compensate for radiation induced changes such as input offset. In particular, as radiation exposure can cause a change in amplifier input offset, the reference voltage may be increased or decreased to compensate for the evolved input offset. The comparator may also be equipped with a proportional to absolute temperature (PTAT) bias cell that provides temperature compensated currents to current source devices in the comparator to render the gain and speed of the comparator approximately constant with temperature over an extended temperature range, for example −40 C to +127 C. Together, the ELTs, dual guard rings, duty cycle adjustment, and PTAT bias cell may provide robust operation even in the presence of high TID, heavy ions, and significant temperature changes.

In systems with at least one readout circuit sending digitized data to data processing electronics, the data processing electronics typically provide a clock signal to the readout circuit to synchronize analog to digital conversion performed by the readout circuit and synchronize transmission of the digitized signals to the data processing electronics. The data processing electronics clock signal generally requires an additional wired or wireless transmission path from the data processing electronics to the readout circuitry that requires additional mass and power to implement. Furthermore, serial transmission of a complete ADC word generally requires knowledge of the position of the least or most significant bits in order to correctly reconstruct the ADC word where data dropout, noise or interference could cause loss or corruption of one or more bits and/or loss of synchronization. To overcome the disadvantages of providing a conventional clock signal for synchronization, the serial data from the ADC can be sent as an oversampled serial bit stream which is then decimated at the receiver end. The modulation source for the bit stream carrier may be a coherently clocked ADC used to generate an Amplitude Shift Keying (ASK) or Binary Phase Shift Keying (BPSK) waveform. In some embodiments, the modulation source may include any coherent bit stream conveying information. The carrier signal may be derived from the Pierce oscillator, for example a buffered/filtered/amplified tap-off of the oscillator feedback signal.

In some embodiments, the undecimated output of a sigma-delta ADC may be used to modulate the carrier. Transmission of an undecimated serial bit pattern is advantageous because decimation may occur at the receiver which may implement various filter functions on the incoming bit stream without regard to where the bit pattern begins and ends as the measurement information is spread over many bits, for example over 256 bits for a 16-bit quantization word. In contrast, as mentioned above, real time serial transmission of complete ADC words requires knowledge by the receiver of the position of the least or most significant bits or the presence of a synchronizing signal or bit pattern. Noise, interference or dropout may corrupt one or more of the position information indicators, the synchronizing signal or the synchronizing bit pattern and inhibit accurate reconstruction of the ADC transmission. However, with an undecimated bit stream, the effects of noise or interference are greatly reduced due to the filtering nature of the decimator. The relatively slow data rate of such a system may be acceptable in continuous monitoring situations where temperature, humidity, vibration or distributed system housekeeping functions must be reported to a base station. For example, a lunar application may include a plurality of monitoring sites for ground temperature and vibrations scattered across a wide area. The resulting modulated carrier wave may be transmitted over a wired or wireless link and then subsequently demodulated.

The disclosed RHBD clock source, referred to herein as the "clock source," includes a comparator based Pierce oscillator that uses a resonator for accurate and stable frequency generation. The oscillator scheme differs from the classic Pierce oscillator which relies on at least one inverter to achieve the required gain. Instead, the disclosed embodiments may utilize a comparator to provide gain and a high frequency signal with the resonator and a linearizing feedback resistor connected between the comparator output and the comparator inverting input. The comparator may be a monolithic CMOS rail-rail design which may exhibit decreases in gain and/or speed as temperature changes, resulting in a deviations in output levels and/or frequency/phase. The comparator may be equipped with bias inputs and a proportional to absolute temperature (PTAT) bias cell coupled to the bias inputs to provide proportional bias current changes as the ambient temperature changes, resulting in a comparator output with stabilized output levels and/or frequency/phase. The non-inverting input of the comparator may be driven with various signals for different applications, and in particular may be driven to compensate for radiation induced input offset.

FIG. 1 illustrates an exemplary clock source 100 according to the disclosed embodiments. The exemplary clock source 100 includes a comparator 102, a PTAT bias circuit 104, a resonator 106 and a feedback resistor 124.

The comparator 102 includes a positive comparator input 108, a negative comparator input 110, a PTAT PMOS bias input 112, a PTAT NMOS bias input 114, and a comparator output 116. The resonator 106 may be coupled between a series resistor 118 connected to the comparator output 116, and the negative comparator input 110. A linearizing feedback resistor 124 may be coupled in parallel with the resonator 106—series resistor 118 combination. The PTAT bias circuit 104 may have a PMOS bias terminal pb coupled to the PTAT PMOS bias input 112, and an NMOS bias terminal nb coupled to the PTAT NMOS bias input 114. For purposes of the disclosed embodiments, the PTAT PMOS bias input 112 will generally be active when a voltage applied to the PTAT PMOS bias input 112 is sufficiently negative with respect to the VSUPPLY node of the comparator 102. Also for purposes of the disclosed embodiments, the PTAT NMOS bias input 114 will generally be active when a voltage applied to the PTAT NMOS bias input 112 is sufficiently positive with respect to the GROUND node of the comparator 102.

The resonator 106 may include an LC tank circuit, a piezo-electric crystal, or any suitable component or components capable of aiding and achieving resonance.

The exemplary clock source 100 may optionally include capacitors 120, 122 coupled to either side of the resonator and a buffer 126 generating an output signal 128.

While typical prior art Pierce oscillators use at least one inverter to achieve the necessary gain for an oscillator, as mentioned above, the disclosed embodiments utilize a bias compensated comparator 102 to generate gain which allows a user to adjust a pulse width or duty cycle of the oscillator output signal. A common mode or pulse width controlling signal may be applied to the non-inverting input 108 of the comparator 102 using, for example, a digital to analog converter (DAC).

Figure 2:
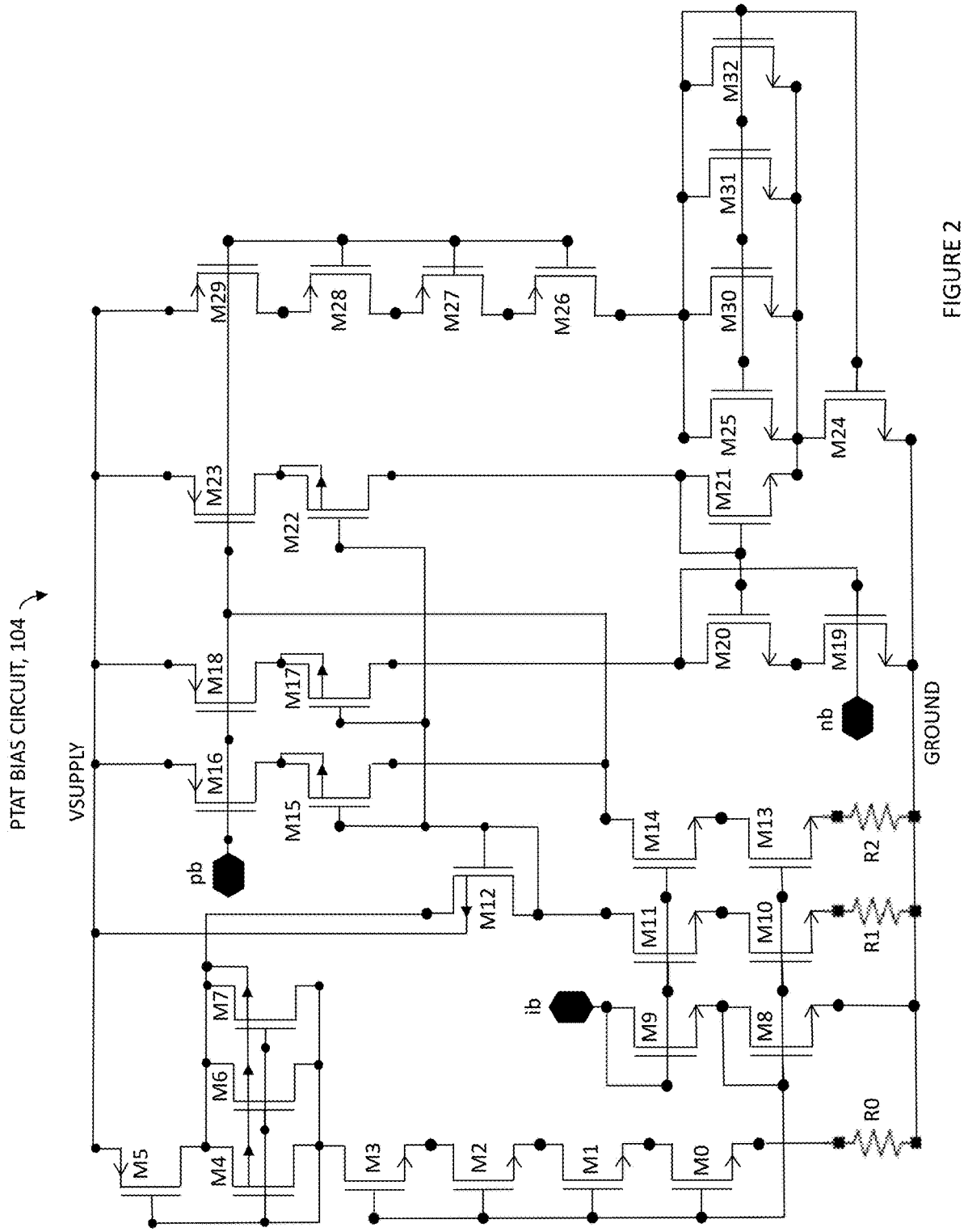
FIG. 2 depicts an exemplary proportional to absolute temperature (PTAT) bias circuit of the RHBD clock source.
Figure 3:
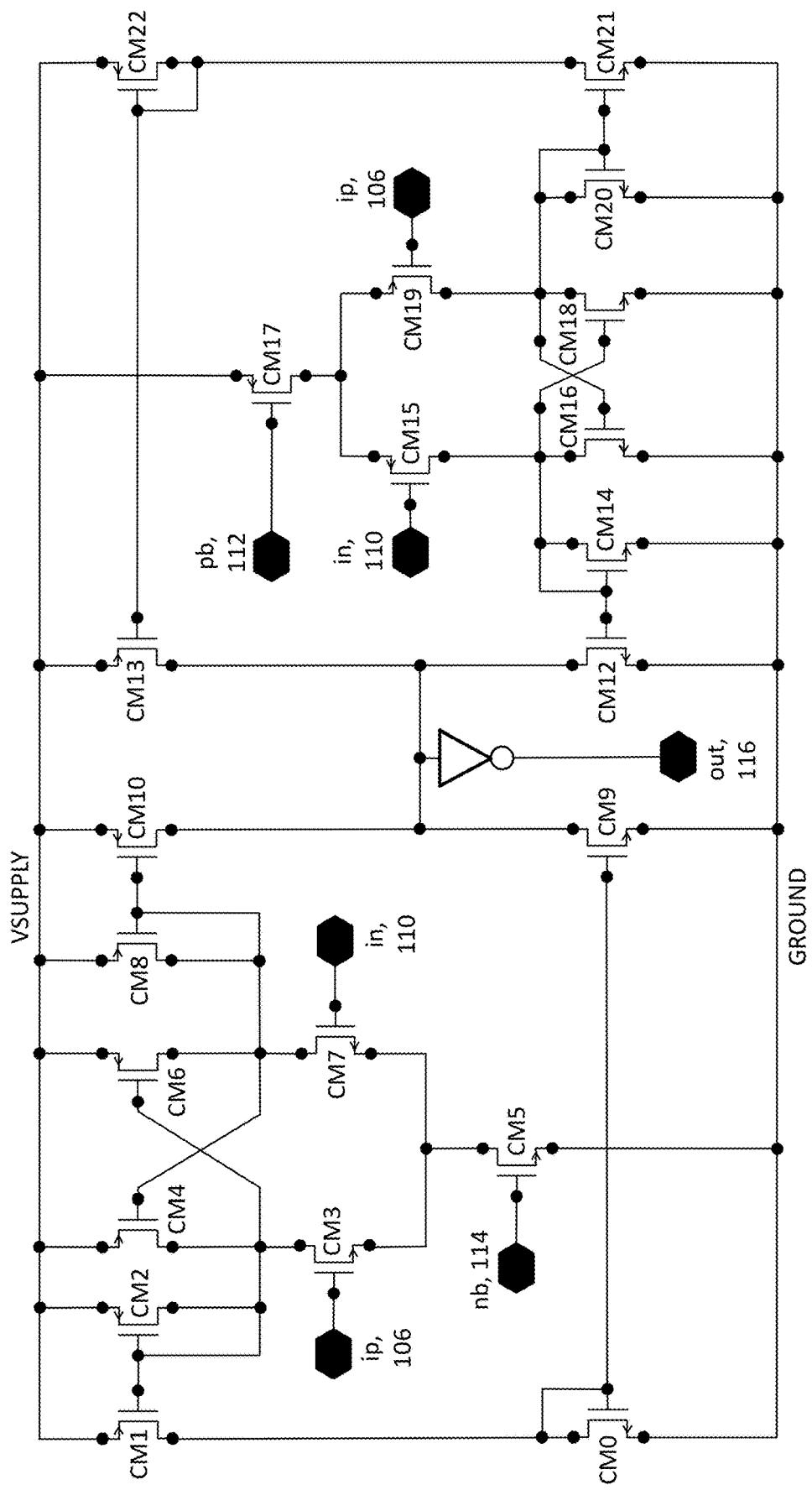
FIG. 3 shows an exemplary comparator circuit used as the gain element in the RHBD clock source.

FIG. 2 depicts an embodiment of the PTAT bias cell 104 and FIG. 3 depicts an embodiment of the comparator 102

The PTAT bias cell may include a bias circuit with PMOS and NMOS current source gate drive voltages that provide near minimum overdrive voltages for the current sources in the comparator 102, and a PTAT gate bias characteristic to compensate for the PMOS and NMOS speed dependence on temperature and thus keep the non-crystal stabilized oscillator frequency approximately stable over a wide temperature range, for example −40 C to +127 C.

The PTAT bias cell 104 (FIG. 2) accepts a bias current from a bandgap reference or other stable current source input ib to the drain of M9. This current is mirrored, scaled and applied to ratioed cascode current source devices which bias the PMOS (M12, M15-M16) and NMOS (M19-M21) current mirrors at the edge of saturation. Assuming that M8-M9 drain-source currents have approximately zero temperature coefficient (TC), the presence of resistors R0, R1, and R2 in the NMOS M0, M10, M13 source connections, respectively, may introduce a positive TC into the associated drain-source currents of M10 and M13. The currents in M10 and M13 are mirrored into the PMOS M15-M16 current mirror and into the NMOS M19-M20 current mirror and thus the bias voltages at nodes nb and pb will vary non-linearly with temperature. When these nb and pb node voltages are applied to the gates 114, 112 of the current source devices CM5 and CM17 (FIG. 3) in the comparator 102, the comparator currents will also vary but in a PTAT manner. This has the effect of rendering the gain and speed of the comparator 102 approximately constant with temperature over an extended temperature range. For example, this embodiment can achieve a 0.01% frequency stability over a −40 C to +127 C temperature range with an LC resonator.

Figure 4:
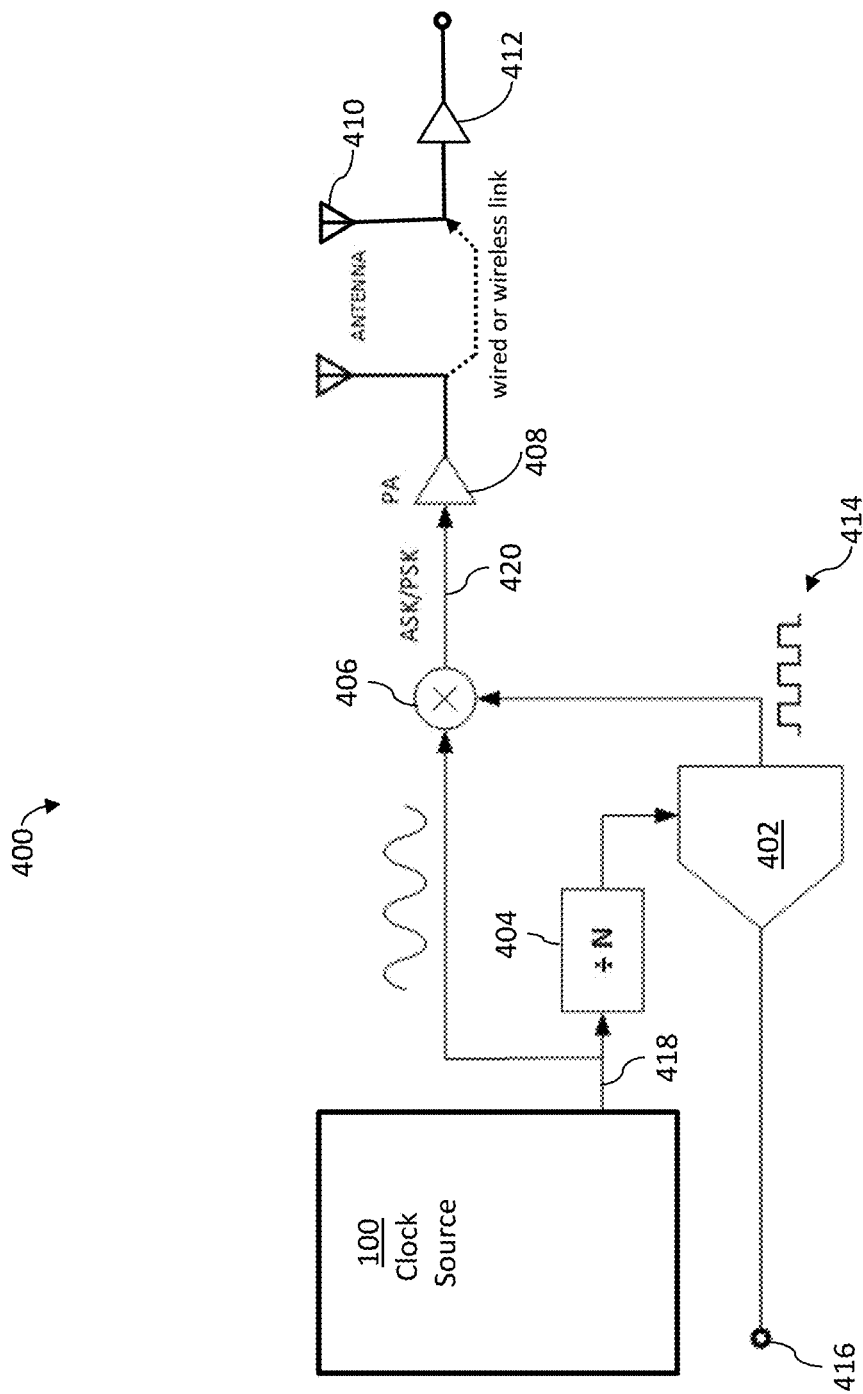
FIG. 4 shows an exemplary transmission circuit for modulating and amplifying a carrier generated by the RHBD clock source.

FIG. 4 shows an exemplary modulation circuit 400 in which the clock source 100 may generate a carrier for modulation, eliminating a need for a separate clock or synchronization signal. The transmitter circuit 400 may include a sigma-delta ADC 402, a clock divider 404, a modulator 406, and a power amplifier 408. The output of the power amplifier 408 may drive a wireless link 410 or a wired link into a receiver 412. The sigma-delta ADC 402 outputs a single bit pulse density waveform 414 which is a digital representation of the input voltage 416 to the sigma-delta ADC 402. The waveform 414 may be visualized as a stream of 1s and 0s with varying density over an arbitrary time span of the input voltage 416. The digital stream 414 may be used to modulate the output 418 of the clock source 100 using the modulator 406. A simple modulation scheme, for example, amplitude shift keying, may be employed to modulate the output 418 of the clock source 100 to be used as a carrier signal. For example, modulator 406 may be a CMOS 2:1 analog multiplexer set to select either a low amplitude version of the clock source output 418 for a logic 0 or a high amplitude version of the clock source output 418 for a logic 1. The varying amplitude output 420 may then be amplified by power amplifier 408 and transmitted via a wired or wireless link 410 to a receiver 412.

Figure 5:
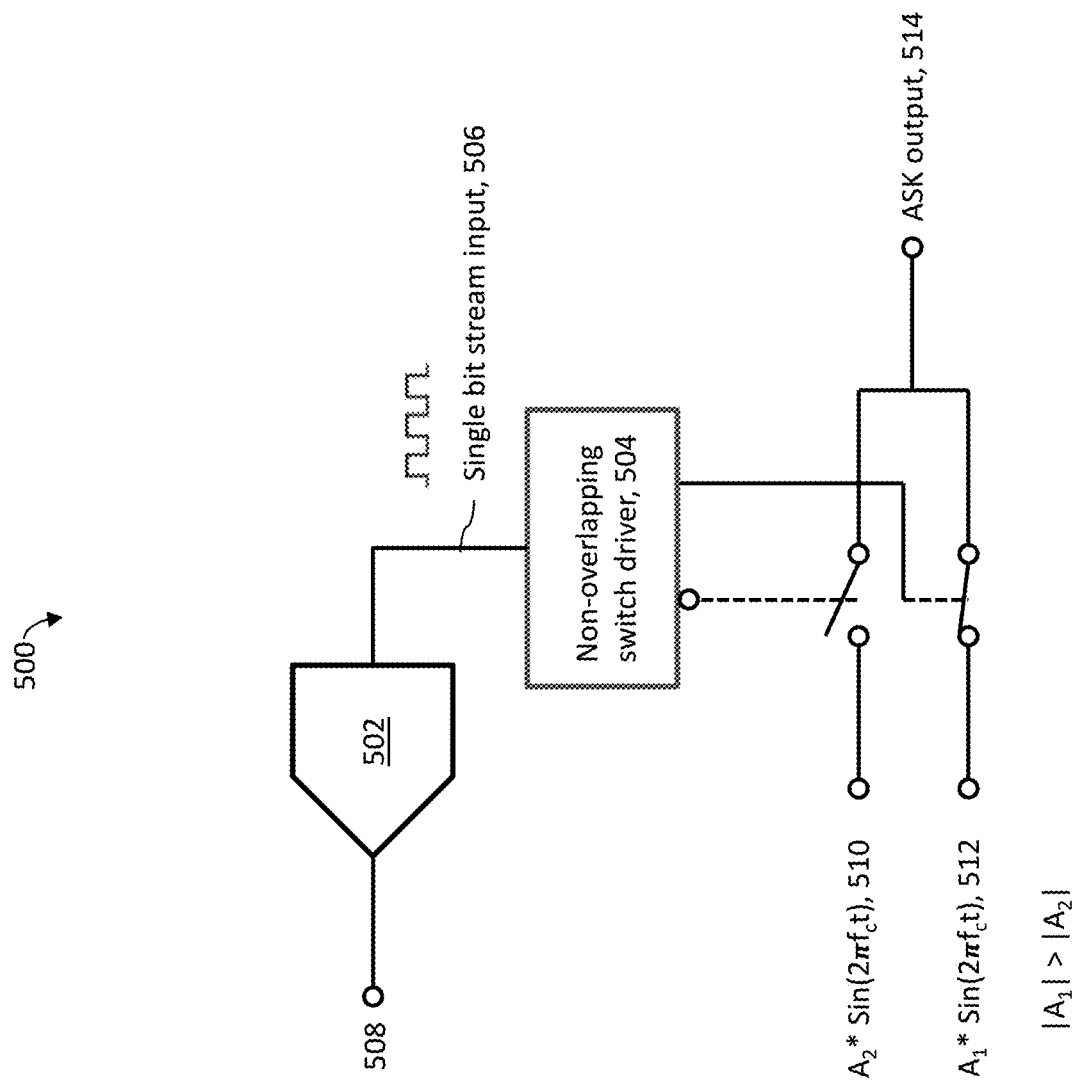
FIG. 5 shows an exemplary amplitude shift keying modulation scheme for modulating a carrier generated by the RHBD clock source.

FIG. 5 shows one example of an amplitude shift keying modulation scheme 500 utilizing a sigma-delta ADC 502 and a non-overlapping switch driver 504. The sigma-delta ADC 502 outputs a single bit pulse density waveform 506 which is a digital representation of the input voltage 508, which may be used to drive the non-overlapping switch driver 504. The non-overlapping switch driver 504 switches between two signals 510, 512 to create an amplitude shift keyed output 514 using two clock signal outputs which are 180 degrees out of phase with the high to low and low to high transitions separated in time to prevent the two outputs from simultaneously being a 1 or a 0. In addition, the non-overlapping switch driver 504 may schedule the transitions to occur near the zero crossing of the carrier signal $f_c$ in the signals 510, 512 to minimize discontinuities in the output 514.

The disclosed clock source is advantageous for use in remote sensing or telemetry applications, especially when combined with a readout chip such as a multi-channel digitizer. The readout chip may use the clock source to generate its own clock signals independent of other system based signals or functions. For example, a remotely sited sensor could continuously monitor data, and report to a base station via a wired or wireless communication link. The data could be broadcast continuously where the readout chip may only require a regulated power source, such as a battery charged by solar or thermoelectric means.

In a space based application, such as a lunar environment, multiple remote sensors monitoring various characteristics, such as ground temperature, seismic activity, and cosmic rays could be deployed all relaying their data back to a lander or other remote station, via wireless communications links at different carrier frequencies.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

What is claimed is:

1. A clock source comprising:
    a comparator having a positive comparator input, a negative comparator input, a proportional to absolute temperature (PTAT) PMOS bias input, a PTAT NMOS bias input, and a comparator output;
    a resonator element and series resistor coupled between the comparator output and the negative comparator input to generate a gain and frequency at the comparator output;
    a feedback resistor between the comparator output and negative comparator input to provide a DC path for linearizing the gain of the comparator; and
    a PTAT bias circuit coupled to the PTAT PMOS bias input and the PTAT NMOS bias input, and configured to drive the PTAT PMOS bias input and the PTAT NMOS bias input to maintain the gain and frequency approximately constant over an operating temperature of the clock source.

2. The clock source of claim 1, wherein the positive comparator input is configured to be driven to compensate for radiation induced input offset.

3. The clock source of claim 1, wherein the positive comparator input is configured to be driven to adjust a pulse width or duty cycle of the comparator output.

4. The clock source of claim 1, wherein the resonator comprises an LC tank circuit or a piezo-electric crystal.

5. The clock source of claim 1, wherein the PTAT PMOS bias input and the PTAT NMOS bias input are coupled to current sources in the comparator and the PTAT bias circuit is configured to provide current to the current sources that varies with temperature.

6. A method of generating a clock signal using a comparator having a positive comparator input, a negative comparator input, a proportional to absolute temperature (PTAT) PMOS bias input, a PTAT NMOS bias input, and a comparator output, the method comprising:
    coupling a resonator element and series resistor between the comparator output and the negative comparator input to generate a clock signal at the comparator output; and
    a feedback resistor between the comparator output and the comparator negative input to provide a DC path for linearizing gain of the comparator; and
    coupling a PTAT bias circuit to the PTAT PMOS bias input and the PTAT NMOS bias input, the PTAT bias circuit configured to drive the PTAT PMOS bias input and the PTAT NMOS bias input to maintain an approximately constant gain and frequency of the clock signal over an operating temperature range of the clock source.

7. The method of claim 6, comprising configuring the positive comparator input to be driven to compensate for radiation induced input offset.

8. The method of claim 6, comprising configuring the positive comparator input to be driven to adjust a pulse width or duty cycle of the comparator output.

9. The method of claim 6, wherein the resonator comprises an LC tank circuit or a piezo-electric crystal.

10. The method of claim 6, comprising coupling the PTAT PMOS bias input and the PTAT NMOS bias input to current sources in the comparator and configuring the PTAT bias circuit to provide current to the current sources that varies with temperature.

* * * * *